(12) United States Patent
Hartman

(10) Patent No.: US 9,582,057 B2
(45) Date of Patent: Feb. 28, 2017

(54) SERVER CHASSIS WITH DUAL PURPOSE BAY FOR STORAGE MODULE OR POWER SUPPLY MODULE

(71) Applicant: DELL PRODUCTS, L.P., Round Rock, TX (US)

(72) Inventor: Corey D. Hartman, Hutto, TX (US)

(73) Assignee: Dell Products, L.P., Round Rock, TX (US)

( * ) Notice: Subject to any disclaimer, the term of this patent is extended or adjusted under 35 U.S.C. 154(b) by 34 days.

(21) Appl. No.: 14/594,552

(22) Filed: Jan. 12, 2015

(65) Prior Publication Data

US 2016/0205804 A1    Jul. 14, 2016

(51) Int. Cl.
| | |
|---|---|
| H05K 5/00 | (2006.01) |
| G06F 1/30 | (2006.01) |
| H05K 7/20 | (2006.01) |
| H05K 7/14 | (2006.01) |
| G11B 33/12 | (2006.01) |

(52) U.S. Cl.
CPC .............. *G06F 1/30* (2013.01); *G11B 33/128* (2013.01); *H05K 7/1487* (2013.01); *H05K 7/20836* (2013.01)

(58) Field of Classification Search
USPC .......................................... 361/728–731, 737
See application file for complete search history.

(56) References Cited

U.S. PATENT DOCUMENTS

| | | | | |
|---|---|---|---|---|
| 5,325,262 | A * | 6/1994 | Ma ......................... | G06F 1/1626 345/905 |
| 5,579,204 | A | 11/1996 | Nelson et al. | |
| 6,040,982 | A | 3/2000 | Gandre et al. | |
| 6,411,506 | B1 * | 6/2002 | Hipp ....................... | G06F 1/189 174/261 |
| 6,661,671 | B1 * | 12/2003 | Franke ..................... | G06F 1/189 361/679.02 |
| 7,715,182 | B2 | 5/2010 | Signer et al. | |
| 7,734,858 | B2 | 6/2010 | Loffink et al. | |
| 7,800,894 | B2 | 9/2010 | Davis | |
| 8,151,011 | B2 | 4/2012 | Chiasson et al. | |
| 8,694,693 | B2 | 4/2014 | Lambert et al. | |
| 8,745,326 | B2 * | 6/2014 | Lubbers ................ | G06F 3/0613 711/114 |
| 8,868,957 | B2 * | 10/2014 | Davis ........................ | G06F 1/30 320/127 |

(Continued)

*Primary Examiner* — Hung S Bui
(74) *Attorney, Agent, or Firm* — Isidore PLLC

(57) ABSTRACT

An information handling system (IHS) includes a chassis that has an accessory bay which is accessible from an exterior of the IHS. The accessory bay supports insertion of one of the PSU and the storage module. A midplane apparatus attached to the chassis at an interior end of the accessory bay has a first electrical connector for electrically connecting to a power supply unit (PSU) connector and a second electrical connector for electrically communicating with a storage module connector when a storage module is inserted into the accessory bay. The IHS detects via the first electrical connector when a PSU is inserted in the accessory bay, and a power controller configures the IHS to receive electrical power from the PSU. The IHS also detects via the second electrical connector when a storage module is inserted in the accessory bay and configures the storage module for access and data storage.

19 Claims, 19 Drawing Sheets

(56) References Cited

U.S. PATENT DOCUMENTS

| | | | |
|---|---|---|---|
| 2002/0027769 A1* | 3/2002 | Kasahara | G06F 1/1616 |
| | | | 361/679.31 |
| 2003/0224824 A1* | 12/2003 | Hanson | G06F 3/0607 |
| | | | 455/560 |
| 2006/0250766 A1* | 11/2006 | Blaalid | G06F 1/187 |
| | | | 361/679.33 |
| 2009/0135558 A1 | 5/2009 | Hughes | |
| 2011/0083992 A1 | 4/2011 | Stuhlsatz et al. | |
| 2014/0025208 A1* | 1/2014 | Allen-Ware | G06F 11/2023 |
| | | | 700/276 |

\* cited by examiner

SERVER CHASSIS WITH DUAL PURPOSE BAY FOR STORAGE MODULE OR POWER SUPPLY MODULE

BACKGROUND

1. Technical Field

This disclosure generally relates to information handling systems (IHSs), and more particular to an IHS chassis having accessory bays that receive modules.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs that are configured as conventional industry rack-mounted servers have front mounted hard drive disk (HDD) arrays. In certain implementation, a dense rack-mounted server can be optimized for maximum compute and Peripheral Component Interconnect (PCI) density. Such specialized front system design may have limited space available for HDDs and other storage subsystems. However, a requirement can still exist in such specialized compute servers for boot or data/cache type operations. Conversely, in some implementations of a dense rack-mounted server, an alternative requirement exists for backup power for increased reliability rather than enhanced storage capability. In yet other implementations of dense-mounted servers, a preference exists for a more economical design without enhanced storage and without backup power.

BRIEF SUMMARY

The illustrative embodiments of the present disclosure provide an information handling system (IHS) that can be selectively provisioned with additional storage capability or additional power capability. For greater reliability, an IHS can be configured with a backup power supply unit (PSU). However, when a backup PSU is not required, the IHS can be readily configured with a storage module instead of the backup PSU. The chassis of the IHS is designed with an accessory bay that can receive either the backup PSU or a storage module, each accessory component having its own electrical connectors. The IHS detects what type of device/component is present in the accessory bay and configures the IHS accordingly for enhanced storage or enhanced power.

According to at least one aspect of the present disclosure, an IHS includes a chassis having an accessory bay that is accessible from an exterior of the IHS. The IHS includes a midplane apparatus attached to the chassis at an interior end of the accessory bay. The midplane apparatus includes both (1) a first electrical connector for electrically connecting to a power supply unit (PSU) connector when a PSU is inserted into the accessory bay and (2) a second electrical connector for electrically communicating with a storage module connector when a storage module is inserted into the accessory bay; wherein the accessory bay supports insertion of one of the PSU and the storage module to enhance the IHS.

According to at least one aspect of the present disclosure, a method is provided of selectively provisioning an IHS with storage and power capabilities. In one embodiment, the method includes forming a chassis having an accessory bay. The method includes attaching a midplane apparatus to the chassis and that is provided at an interior end of the accessory bay. The method includes presenting a first electrical connector on the midplane apparatus to mate with a corresponding PSU connector electrical connector of a PSU when inserted into the accessory bay. The method further includes presenting a second electrical connector that is presented on the midplane apparatus to mate with a corresponding storage module connector of a storage module when inserted into the accessory bay.

According to at least one aspect of the present disclosure, in one embodiment a method is provided for configuring the storage and power capabilities of the IHS by selectively provisioning either a storage module or PSU into an accessory bay. The method includes detecting, via the first electrical connector, a PSU in the accessory bay. The method includes configuring the IHS to receive electrical power from the PSU in response to detecting the PSU. The method further includes detecting, via the second electrical connector, a storage module in the accessory bay. The method includes configuring the IHS and the storage module for additional data access and storage capacity in response to detecting the storage module.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
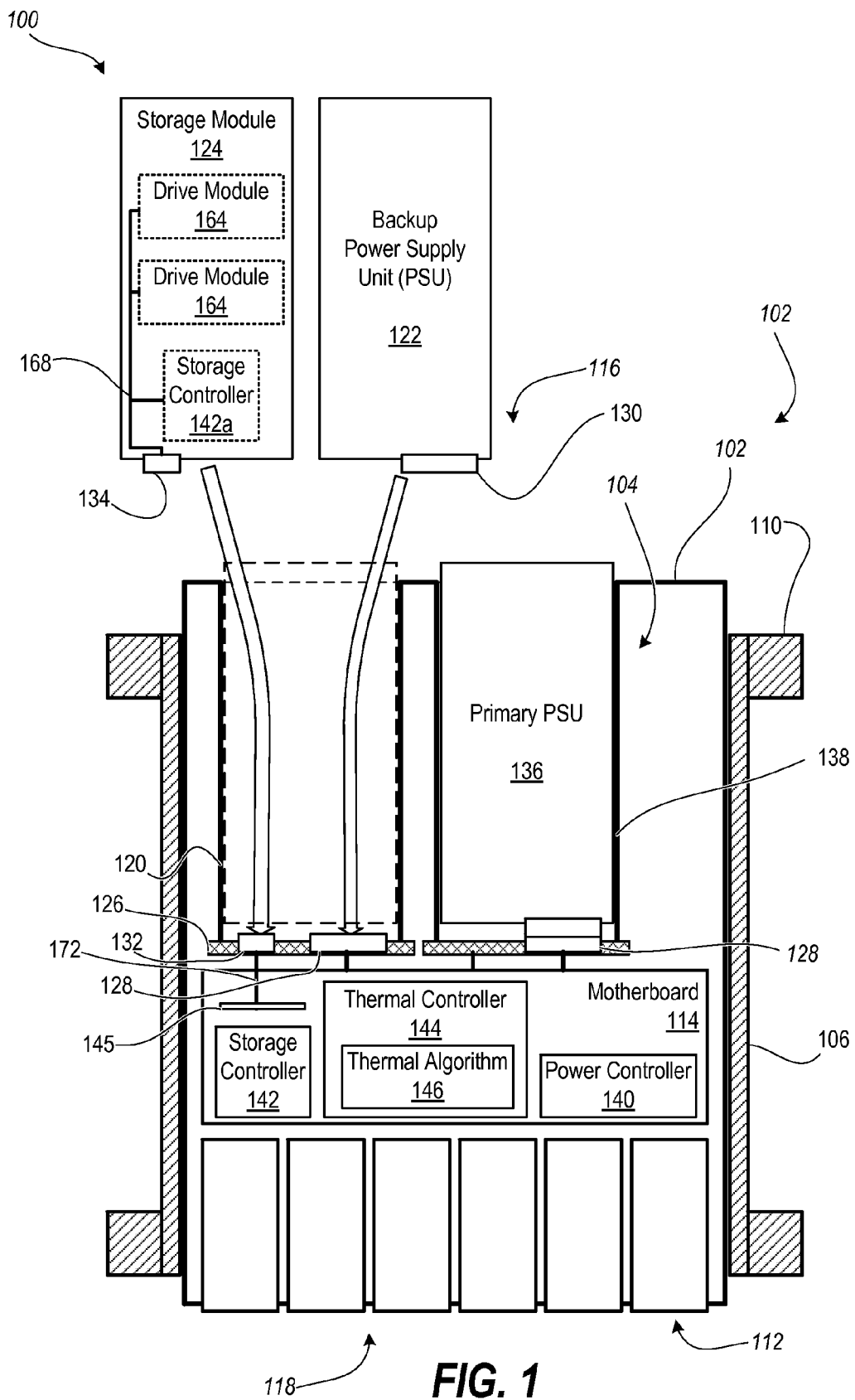
FIG. 1 illustrates a diagrammatic view of an information handling system (IHS) that is selectably configured with additional storage or power capabilities, according to one or more embodiments.

The present disclosure provides an information handling system (IHS) that has a server chassis that can be densely populated yet provide for selective configuration or reconfiguration for additional power capability or for additional data storage capability. In one embodiment, a chassis of the IHS includes an accessory bay that is accessible from an exterior of IHS. The IHS also has a midplane apparatus attached to the chassis at an interior end of the accessory bay with a first electrical connector for electrically connecting to a power supply unit (PSU) connector and a second electrical connector for electrically communicating with a storage module connector when a storage module is inserted into the accessory bay. The accessory bay supports insertion of one of the PSU and the storage module. The IHS can detect, via the first electrical connector, a PSU in the accessory bay, and the IHS configures the IHS to receive electrical power from the PSU in response to detecting the PSU. The IHS can detect, via the second electrical connector, a storage module in the accessory bay, and the IHS configures the storage module for data access and storage in response to detecting the storage module.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example IHS 100 that includes a rack-mounted server 102. The 102 server includes functional compute components 104 that are housed in a chassis 106. The rack-mounted server 102 is selectably configurable with additional storage or power capabilities according to one of a plurality of various embodiments of the disclosure. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

With continued reference to FIG. 1, the IHS 100 includes the rack-mounted server 102 that can be configured to have certain functional compute components 104 inserted from an exterior of a chassis 106 that is already mounted into a rack 110. For example, a rack-mounted server 102 that is densely populated can be optimized for specialized front payload 112 of Peripheral Component Interconnect (PCI) or other devices that communicate with a motherboard 114. Limited space is thus available for drive modules such as hard disk drives (HDDs) and solid state drives (SSDs). A rear side 116 of the rack-mounted server 102 is generally devoted to power and cooling components rather than storage. With other rack-mounted servers 102 as well as other IHSes 100 similarly aligned, the rear side 116 of the rack-mounted servers 102 is often referred to as being accessed from a "hot aisle side". A front side 118 of the servers is thus often referred to as being accessed from the "cold aisle side".

According to the disclosure, the IHS 100 includes a chassis 106 having an accessory bay 120 that is accessible from an exterior of the IHS 100. In one embodiment, the accessory bay 120 can be accessed from the rear. The accessory bay 120 supports insertion of one of a PSU 122 and a storage module 124 to enhance the IHS 100. A midplane apparatus 126 is attached to the chassis 106 at an interior end of the accessory bay 120. The midplane apparatus 126 has a first electrical connector 128 for electrically connecting to a PSU connector 130 when the PSU 122 is inserted into the accessory bay 120. The midplane apparatus 126 has a second electrical connector 132 for electrically communicating with a storage module connector 134 when the storage module 124 is inserted into the accessory bay 120. For example, the second electrical connector 132 can conform to SAS (Serial-Attached Small Computer System Interface) or SATA (Serial Advanced Technology Attachment) computer bus standards for storage HDDs.

In an exemplary embodiment, the midplane apparatus 126 can be an apparatus of separate structures that are approximately aligned at a midplane location within the chassis. For example, the first electrical connector 128 can be physically and electrically attached to a bulkhead 145 of the IHS 100 whereas the second electrical connector 132 can be electrically connected to the bulkhead 145 via a storage cable 172.

In an exemplary embodiment, the PSU 122 serves as a backup PSU in order to increase reliability of the rack-mounted server 102 in the event of a failure of primary PSU 136, which can also be replaceably installed in a primary PSU bay 138. A power controller 140 can function (i) to detect a backup PSU 122 inserted into the accessory bay 120, (ii) to detect a failure of the primary PSU 136, and (iii) to switch from the primary PSU 136 to the backup PSU 122 in response to detecting both a presence of the backup PSU 122 and the failure of the primary PSU 136. In an alternate embodiment, the power controller 140 can be configured to or can configure the IHS to concurrently utilize portions of both the primary PSU 136 and the backup PSU 122 (operating simply as a second available PSU) in response to detecting a presence of the backup PSU 122. This alternate embodiment can also be leveraged to support certain overclocking operations of the IHS, which would have access to a larger power bandwidth for high speed operations, etc.

In an exemplary embodiment, a storage controller 142 can detect, via the second electrical connector 132, a storage module 124 that is inserted into the accessory bay 120. The storage controller 142 can configure the IHS 100 to utilize the additional storage capacity and configure the storage module 124 for access and data storage, in response to detecting the storage module 124. In one embodiment, the storage controller 142 can be a base motherboard controller. In one embodiment, the first electrical connector 128 is on the motherboard 114 rather than on the midplane apparatus 126 to simplify power connections.

In one embodiment, a thermal controller 144 detects, via the first and second electrical connectors 128, 132, whether a storage module 124 or a PSU 122 is provisioned in the accessory bay 120. The thermal controller 144 configures a thermal algorithm 146 to cool the specific inserted storage module 124 or PSU 122 in response to detecting the storage module 124 or the PSU 122. In one alternate embodiment, the thermal controller 144 is communicatively coupled to the power controller 140 and to the storage controller 142. Information about which device among the PSU 122 and the storage module 124 is currently inserted in the accessory bay 120 is communicated to the thermal controller 144 by the specific one of the power controller 140 and the storage controller 142.

The storage module 124 can contain drive modules 164 of various technologies such as SSDs and HDDs as well as different form factors. For clarity, two drive modules 164 are depicted as assembled in the storage module, communicating via an interposer structure 168 to the second electrical connector 132. Alternatively, each drive module 164 can have a dedicated cable and a dedicated electrical connector to the midplane apparatus 126 or to a bulkhead 145 of the IHS 100. Embodiments according to aspects of the present innovation thus can employ (1) a mounting configuration of one or more drive modules 164 as part of the storage module 124, (2) provide appropriate interposer or cable connections for the drive modules 164 within storage module 124, and (3) provide a proper amount of system connections at the bulkhead 145.

For clarity, storage controller 142 and power controller 140 are depicted as separate components external to the storage module 124 and the backup PSU 122. In one embodiment, an onboard storage controller 142*a*, such as a SATA or SAS controller, can be located in the storage module 124. The onboard storage controller 142*a* can alleviate a requirement for additional hardware to be implemented in the chassis 106. Communication between the onboard storage controller 142*a* can be via a PCI link that is routed to the midplane apparatus 126 and bulkhead (not shown) via an interposer structure 168.

Figure 2:
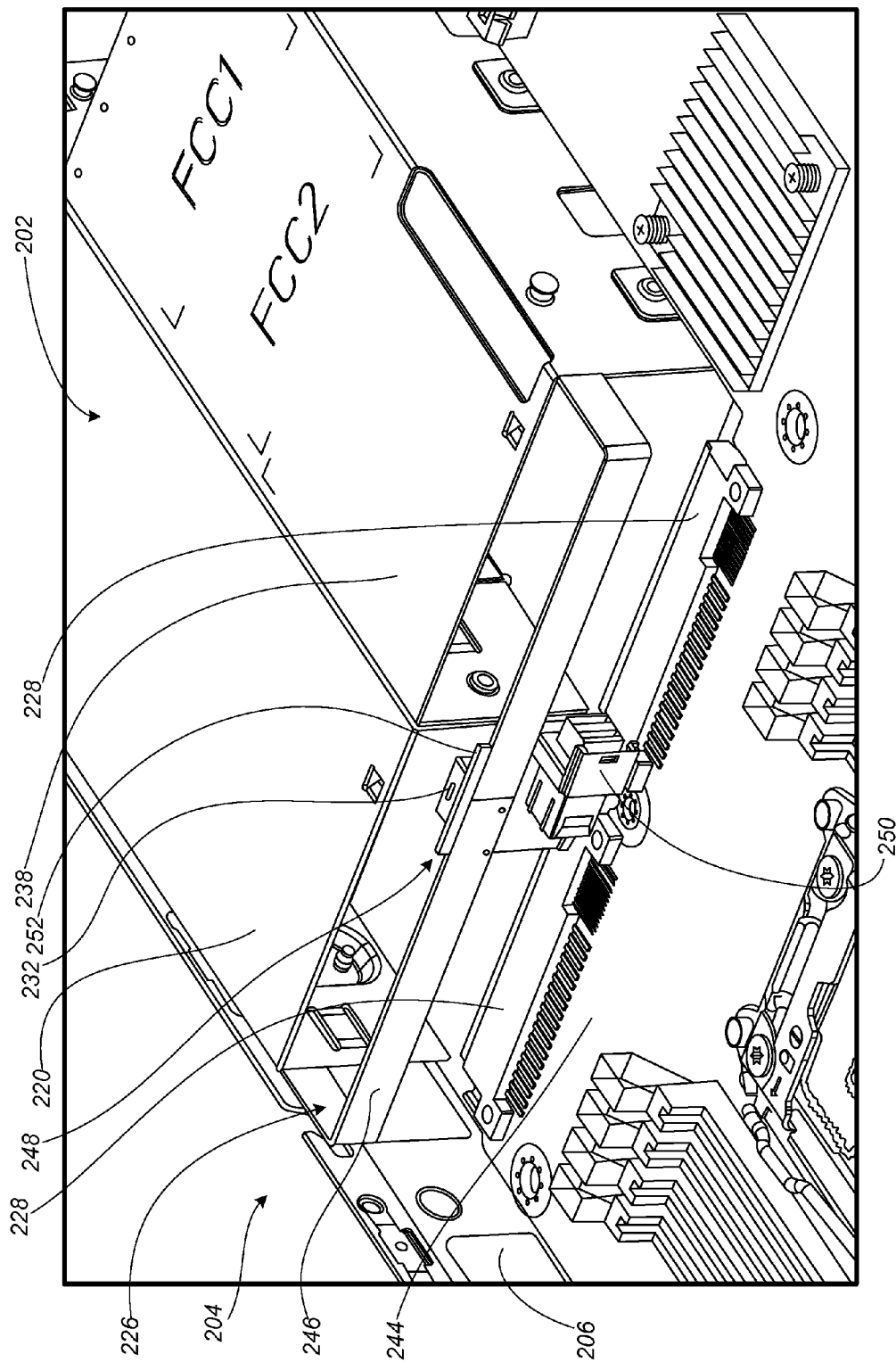
FIG. 2 illustrates a forward left perspective view of a primary PSU bay and an accessory bay of an example IHS, according to one or more embodiments.
Figure 3:
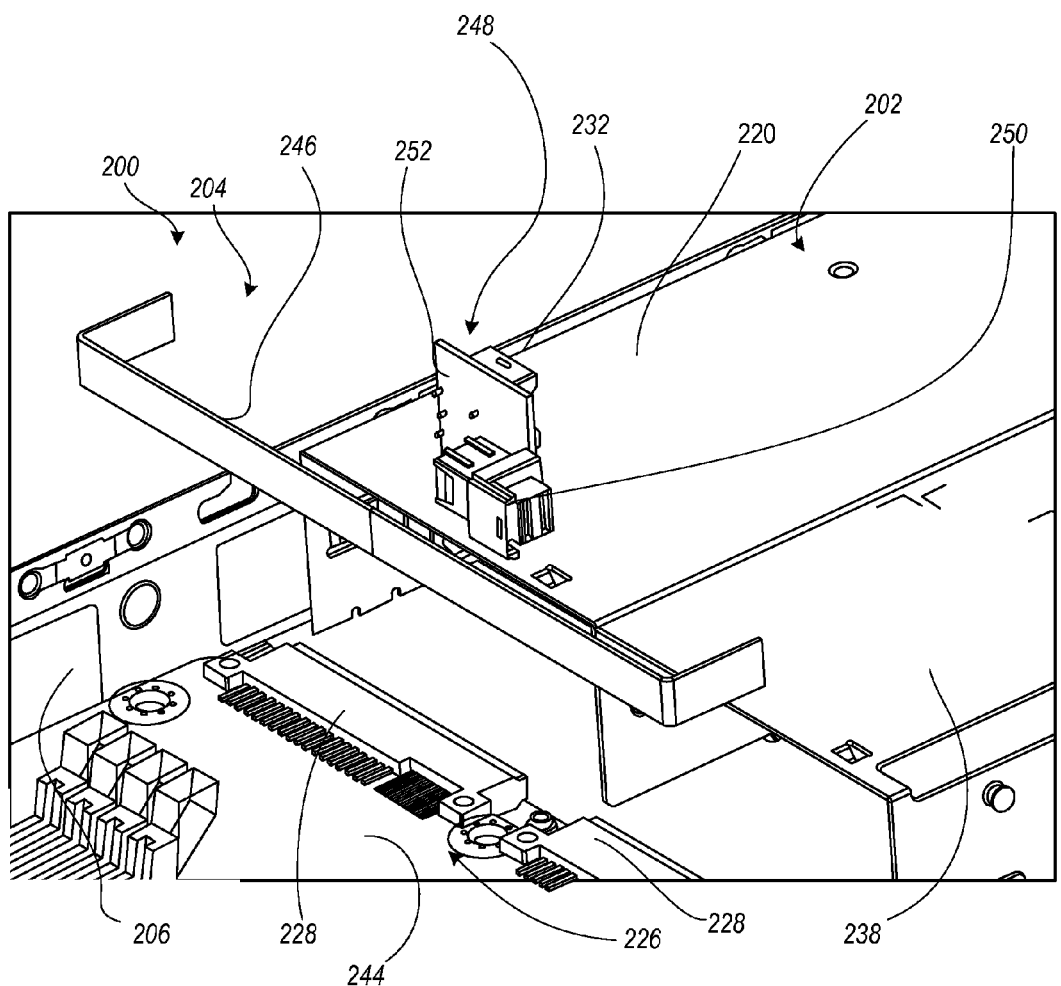
FIG. 3 illustrates a forward left perspective view of the primary PSU bay and the accessory bay of the example IHS of FIG. 2 that are both empty and partially disassembled, according to one or more embodiments.
Figure 4:
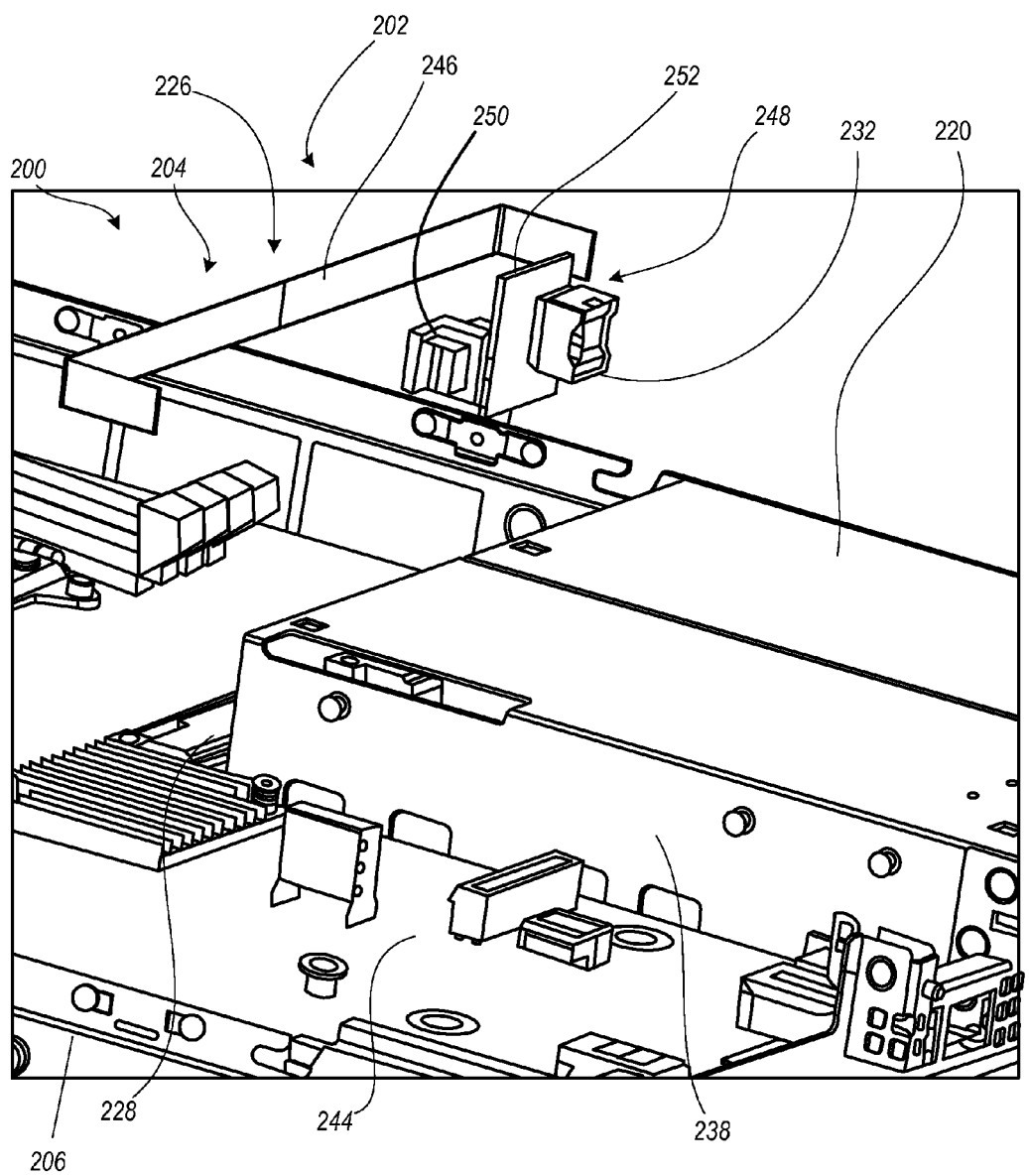
FIG. 4 illustrates a rear left perspective view of the primary PSU bay and the accessory bay of the example IHS of FIG. 3 that are both empty and partially disassembled, according to one or more embodiments.
Figure 5:
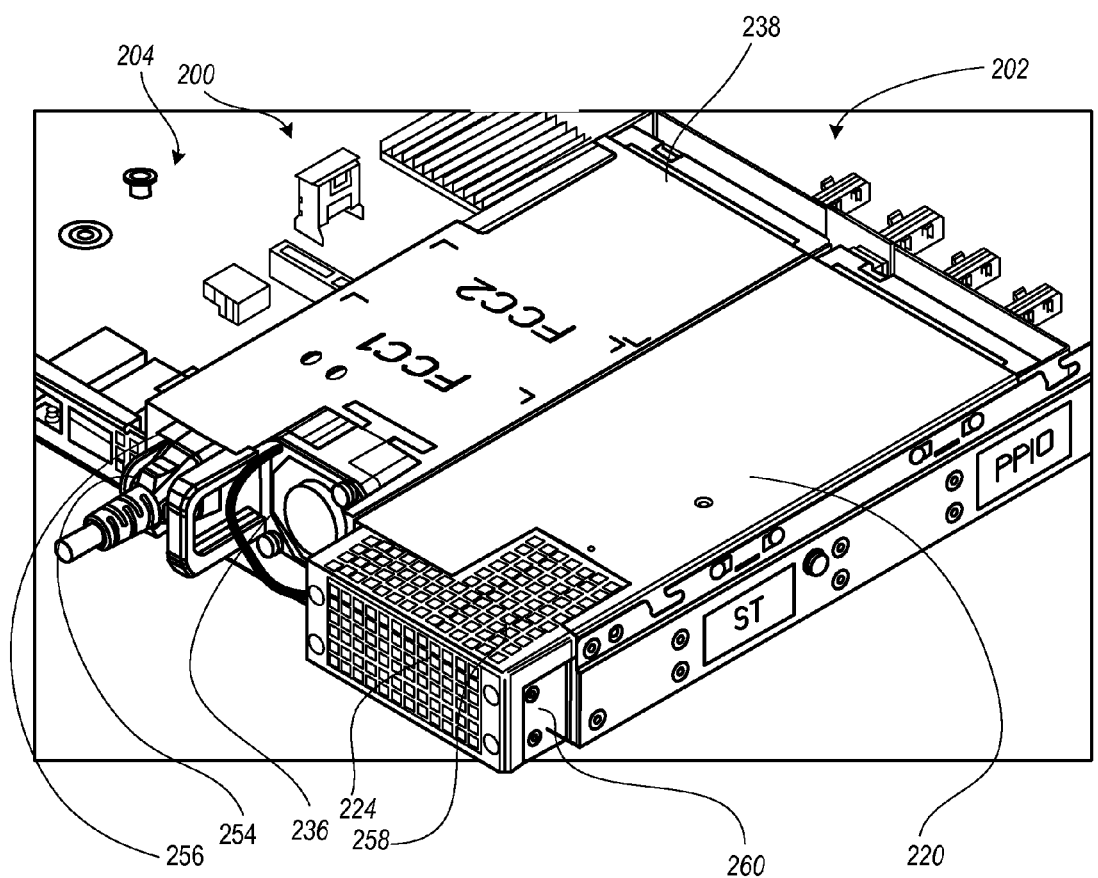
FIG. 5 illustrates a rear right perspective view of the example IHS of FIG. 2 with a storage module provisioned in the accessory bay, according to one or more embodiments.

FIGS. 2-4 illustrate an IHS 200 that includes a rack-mounted server 202 having compute components 204 that are housed in a chassis 206. The chassis 206 includes a primary PSU bay 238 and an accessory bay 220 that are both empty, according to one or more embodiments. For example, the rack-mounted server 202 can be initially configured with the accessory bay 220 empty for economical reasons. The rack-mounted server 202 can then be reconfigured with a backup PSU 222 (FIG. 6) installed in the accessory bay 220 for critical functions that need to be maintained without power interruptions. Alternatively or subsequently, the rack-mounted server 202 can be reconfigured with a storage module 224 installed in the accessory bay 220 for increased storage requirements for data/cache or to support a boot capability (FIG. 5). Each of the primary PSU bay 238 and the accessory bay 220 include a midplane apparatus 226 for electrical connections.

In one embodiment, both power and storage connectors can be on a midplane apparatus that is thus connected entirely to the motherboard. In another embodiment, a power connector and a storage connector can be attached to separate assemblies with both in a fixed arrangement to the accessory bay to create a midplane apparatus. In a particular embodiment, the midplane apparatus 226 includes a first electrical connector 228 for each of the primary PSU bay 238 and the accessory bay 220 that is mounted to a base 244 of the chassis 206. The midplane apparatus 226 thus includes the first electrical connector 228 that is physically and electrically connected to a motherboard 214 of the IHS 200. The midplane apparatus 226 also includes a brace 246 that supports and vertically aligns a second electrical connector 232 to the first electrical connector 228 of the accessory bay 220. The second electrical connector 232 is part of a midplane board assembly 248 that also supports a midplane-to-motherboard cable connector 250. A midplane board 252 of the midplane board assembly 248 defines a midplane location that does not interfere with the first electrical connector 228 and serves as an attachment point for the brace 246, second electrical connector 232, and cable connector 250.

FIG. 5 illustrates the IHS 200 which includes rack-mounted server 202 that includes compute components 204 that are housed in the chassis 206. The compute components 204 can include a primary PSU 236 and storage module 224, according to one or more embodiments. The primary PSU 236 is received within a primary PSU bay 238 and the storage module 224 is received in an accessory bay 220. The primary PSU bay 238 and the accessory bay 220 each have a rectangular caddy sleeve 240 (FIG. 9) that are sized to closely encompass lateral, top and bottom sides of the primary PSU 236 and storage module 224, respectively. The storage module 224 provides a solution for a dense server optimized for specialized front payload that has limited space available for HDD and storage subsystem, which can be needed for boot or data/cache devices. The accessory bay 220 creates a storage subsystem that mimics the size, behavior, and connectivity of a PSU. Thereby, the IHS can be enhanced by trading off usage of one PSU for the ability to add a storage device, avoiding the need to provide dedicated space in system layout for storage. A portion of the storage module 224 is visible including a venting structure 258 and a carrier 260.

Figure 6:
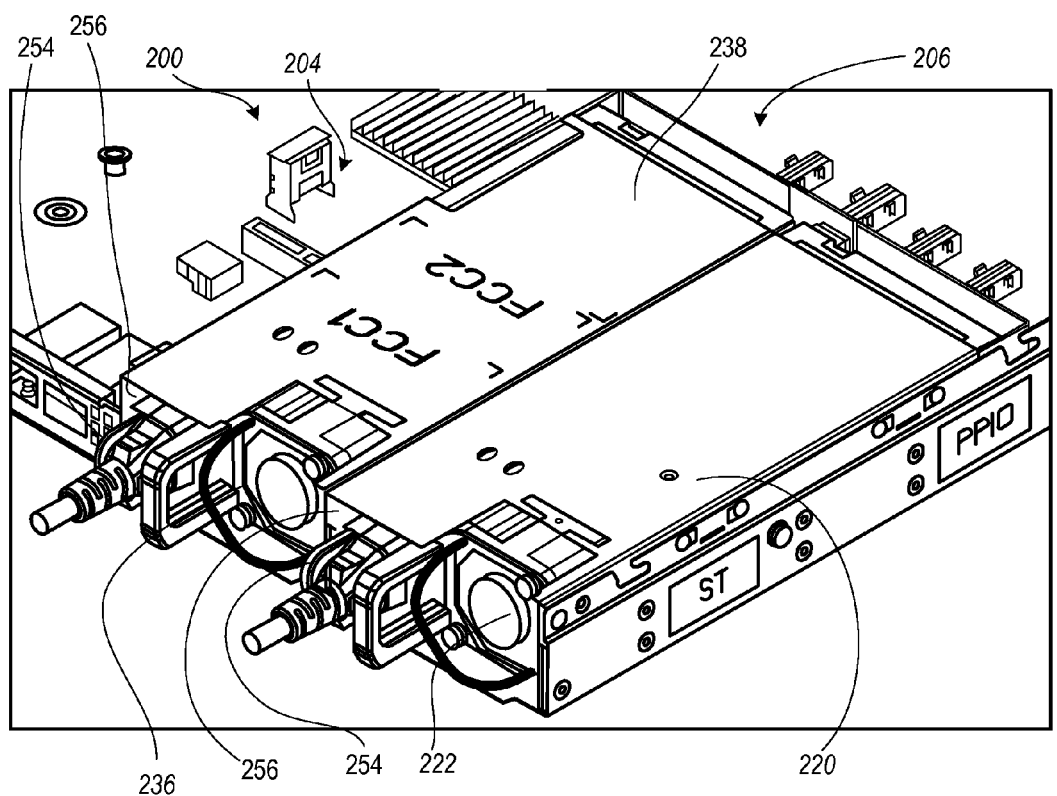
FIG. 6 illustrates a rear right perspective view of the example IHS of FIG. 2 with a backup PSU provisioned in the accessory bay, according to one or more embodiments.

FIG. 6 illustrates the example IHS 200 with the primary PSU 236 installed into the primary PSU bay 238 and with a backup PSU 222 provisioned in the accessory bay 220, according to one or more embodiments. The primary PSU 236 and the backup PSU 222 can be identical components with each providing a latch 254 that engages a respective latch engaging surface 256 in the primary PSU bay 238 and the accessory bay 220. Replacement of the primary PSU 236, the backup PSU 222 or the storage module 224 (FIG. 5) is facilitated by the latch 254 that does not require tools. Replacement is further facilitated by the chassis 206 providing an exterior opening that is accessible without having to remove the rack-mounted server 202 from a rack and to open up the chassis 206.

Figure 7:
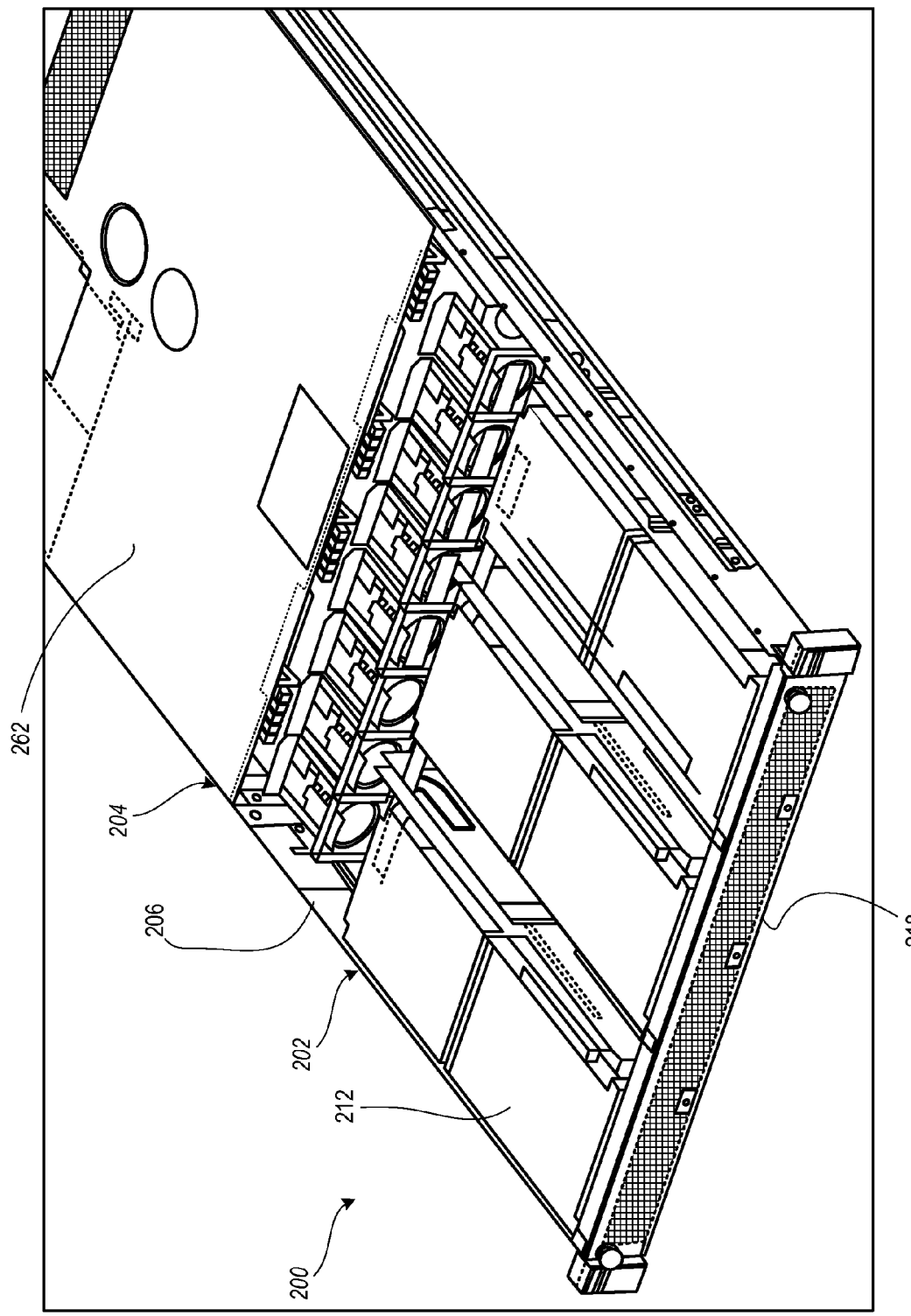
FIG. 7 illustrates a front left perspective view of the example IHS of FIG. 2, according to one or more embodiments.

FIG. 7 illustrates that the rack-mounted server 202 can be densely populated with specialized front payload 212 of PCI cards or other devices. The front side 218 of the chassis 206 does not provide a slot for adding a storage module 224 (FIG. 5). A shroud 262 over a rear portion of the chassis 206 directs airflow.

Figure 8:
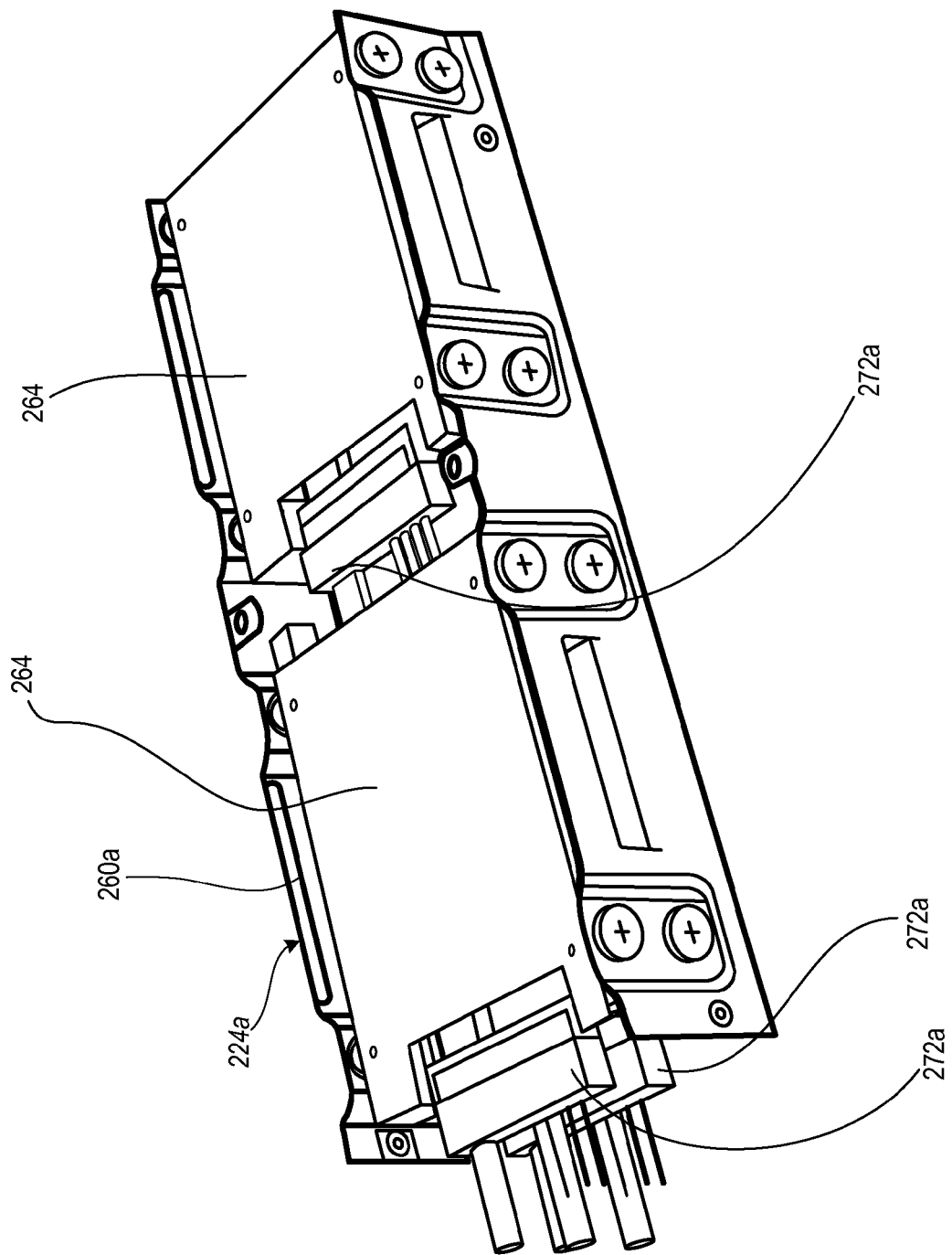
FIG. 8 illustrates a left perspective view of an alternative storage module of the IHS, according to one or more embodiments.

FIG. 8 illustrates another example storage module 224*a* for the IHS 200 (FIG. 2), according to one or more embodiments. Drive modules 264 are mounted into a carrier 260*a*. Drive modules 264 can be HDDs and/or SSDs or other storage devices with each electrically connected to a computer bus storage cable 272*a* that is individually connected to a motherboard 114 (FIG. 1), rather than being integrated into a storage module connector 234 (FIG. 12).

Figure 9:
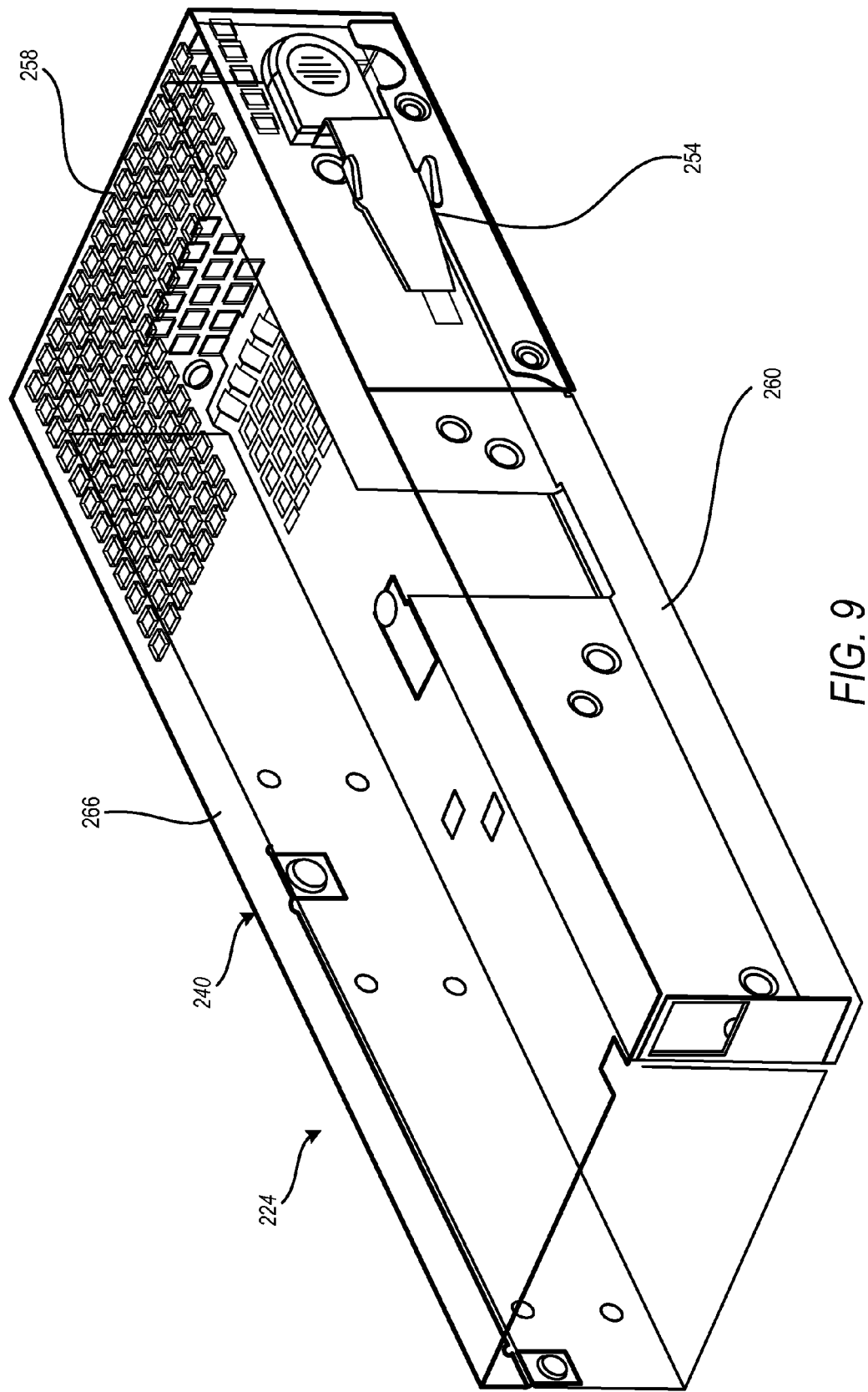
FIG. 9 illustrates a front left perspective view of a carrier for the storage module of the IHS of FIG. 2, according to one or more embodiments.
Figure 10:
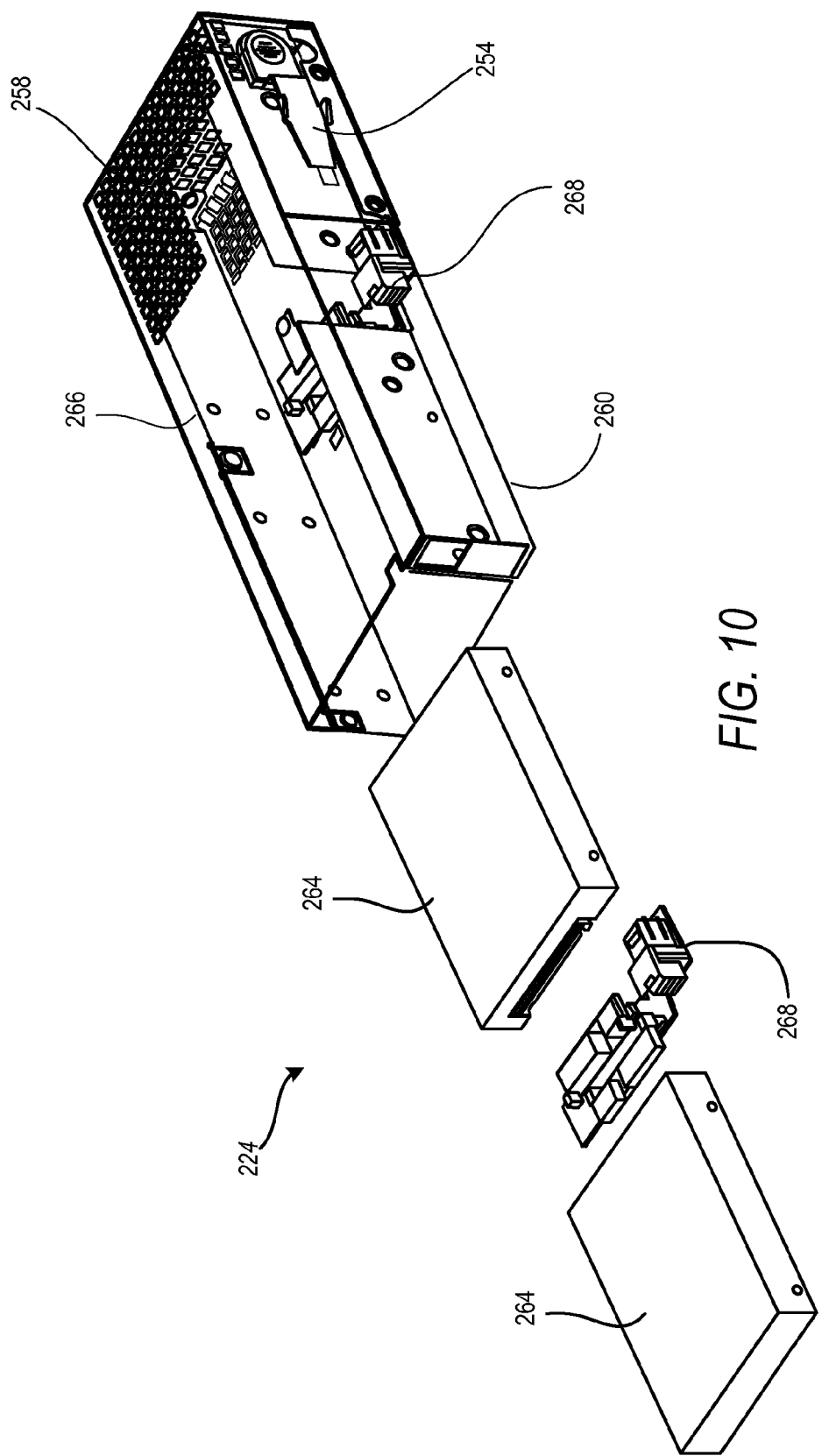
FIG. 10 illustrates a front left disassembled view of the carrier of FIG. 9 with drive modules and an interposer structure, according to one or more embodiments.
Figure 11:
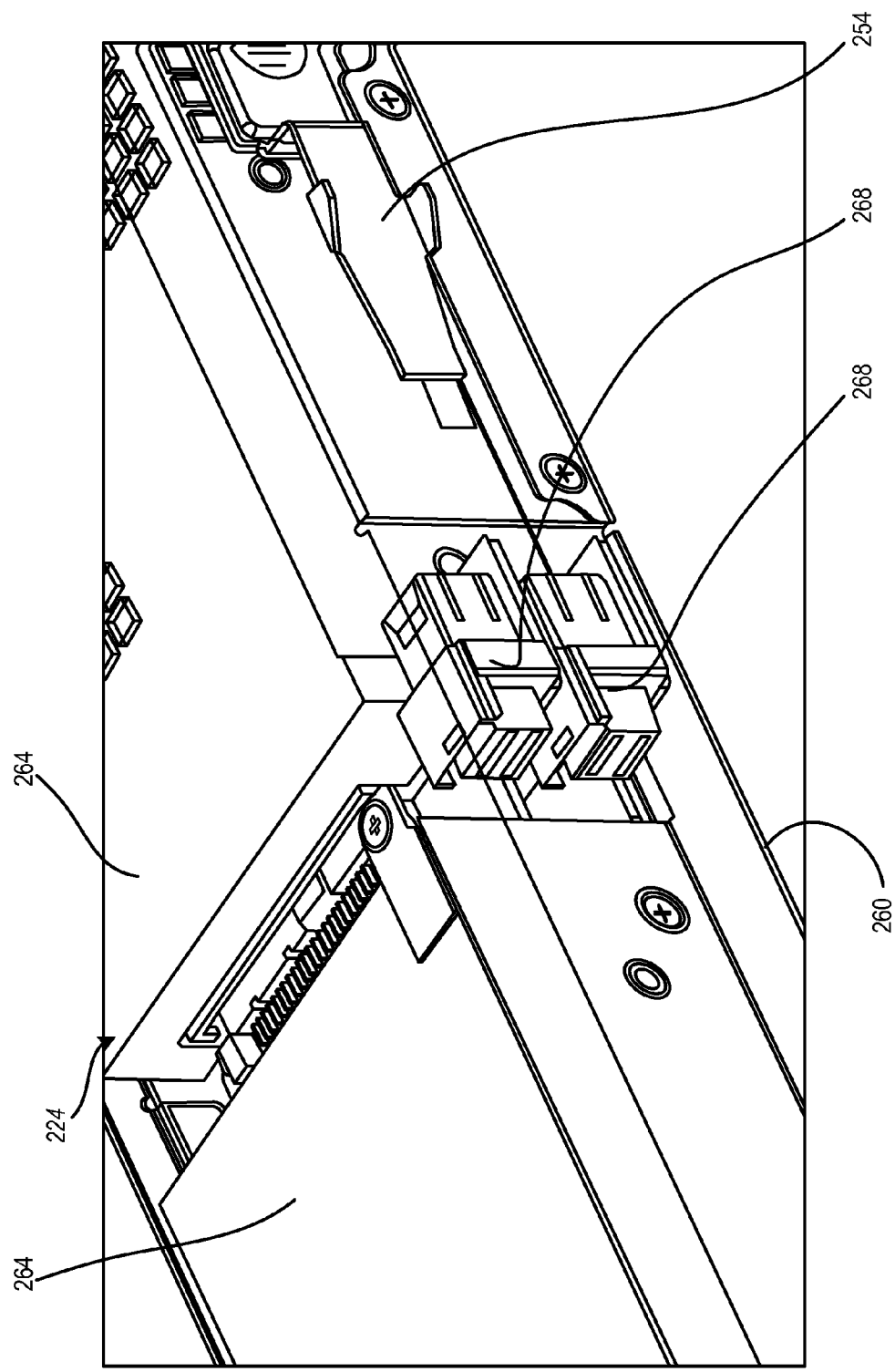
FIG. 11 illustrates a left perspective detail view of the carrier of FIG. 10 partially cutaway to view the drive modules connected to the interposer structure, according to one or more embodiments.
Figure 12:
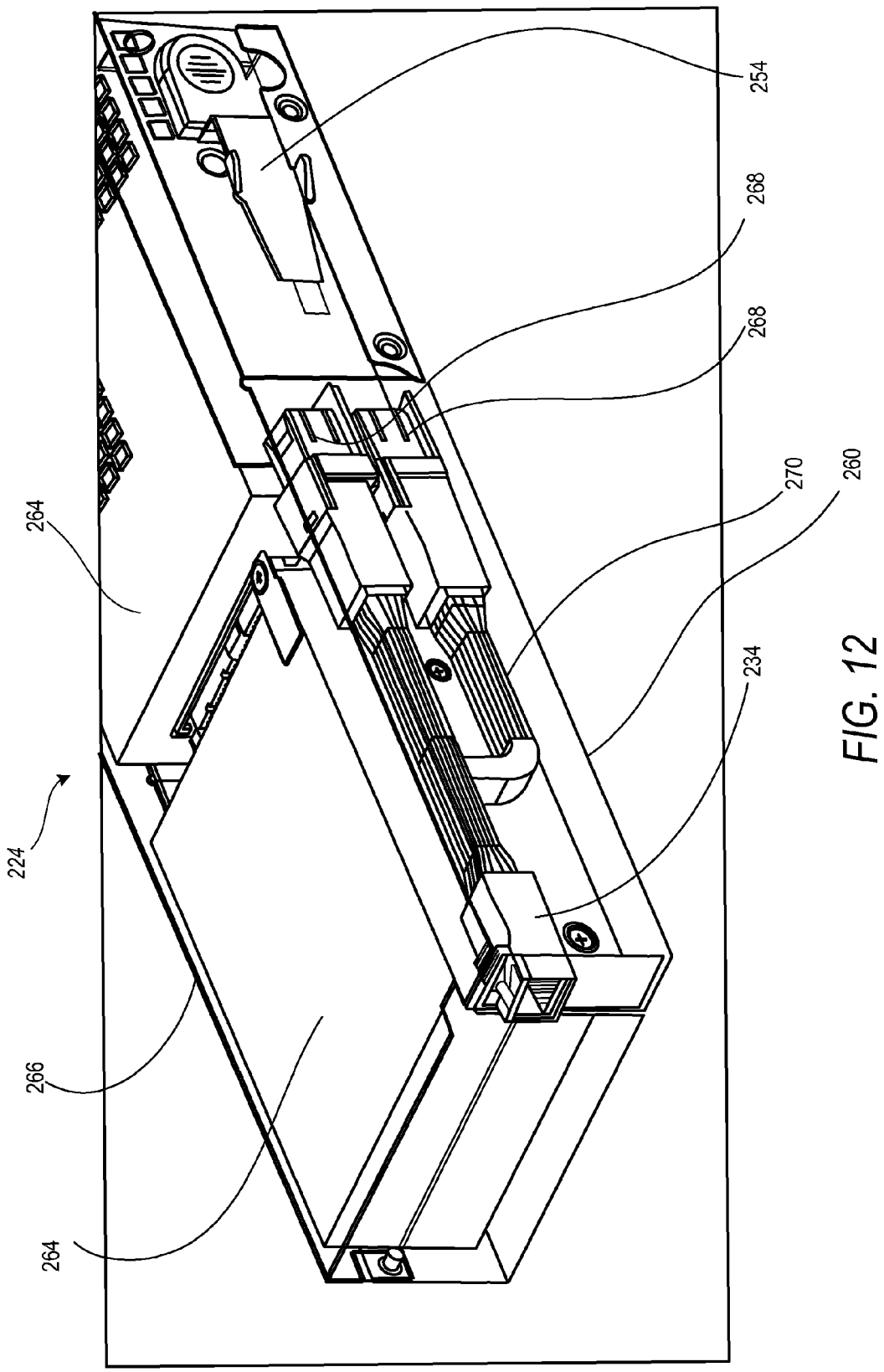
FIG. 12 illustrates a left perspective detail view of the carrier of FIG. 11 partially cutaway to view an interposer cable, according to one or more embodiments.
Figure 13:
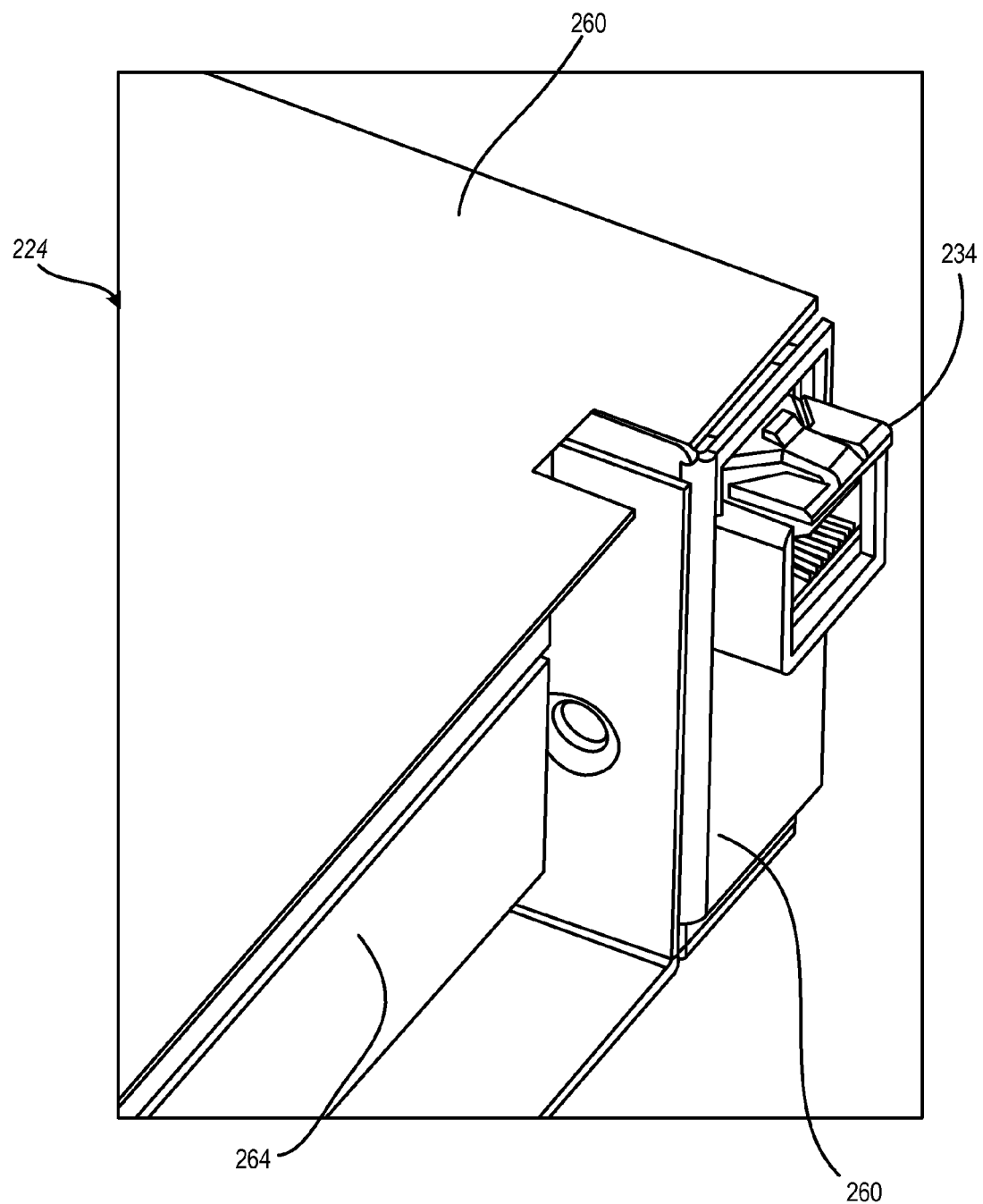
FIG. 13 illustrates a rear left perspective detail view of a storage module connector of the carrier of FIG. 10.
Figure 14:
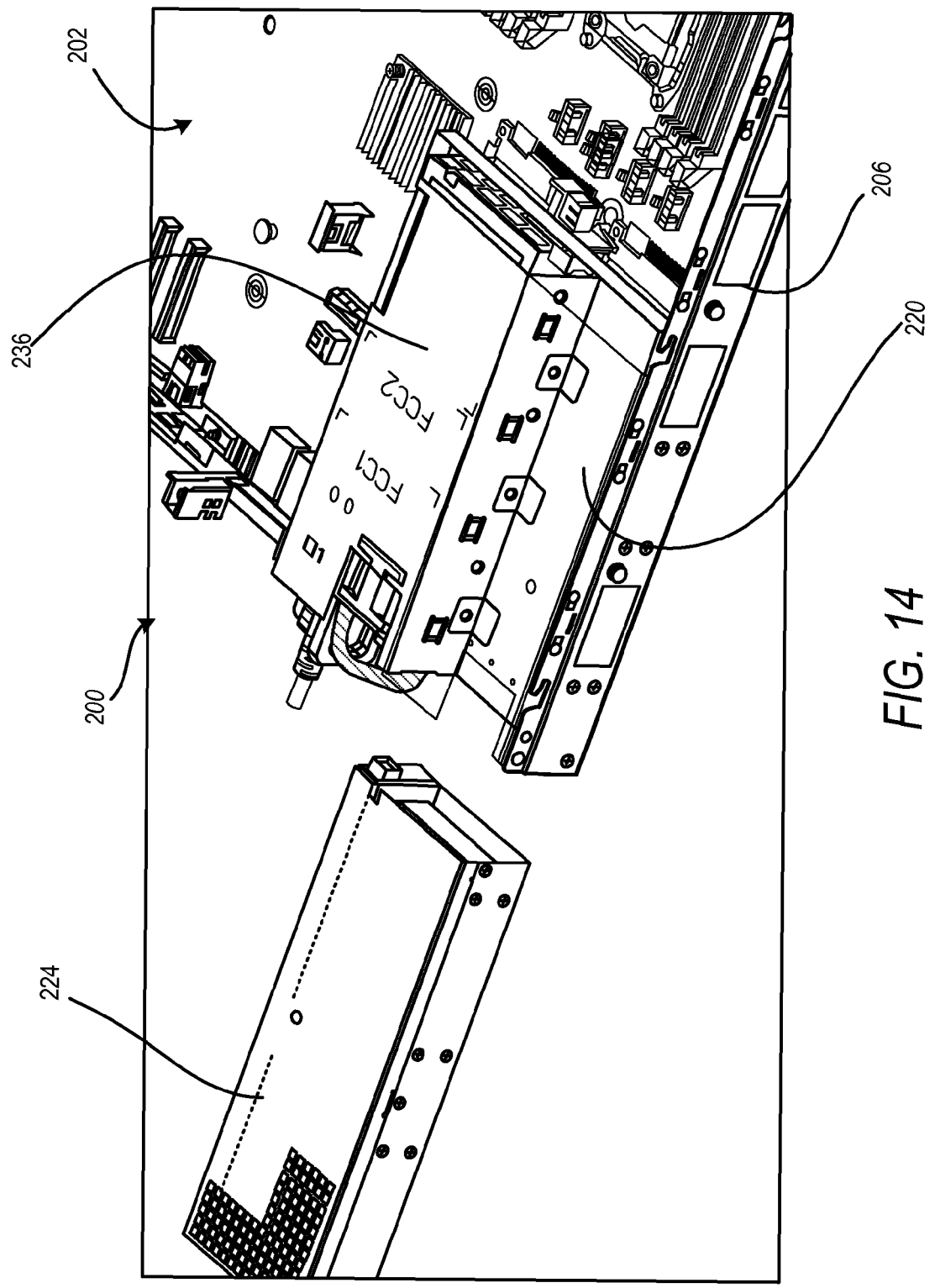
FIG. 14 illustrates a rear left perspective view of the primary PSU bay with a primary PSU and the accessory bay of the example IHS of FIG. 2 that is receiving the storage module, according to one or more embodiments.
Figure 15:
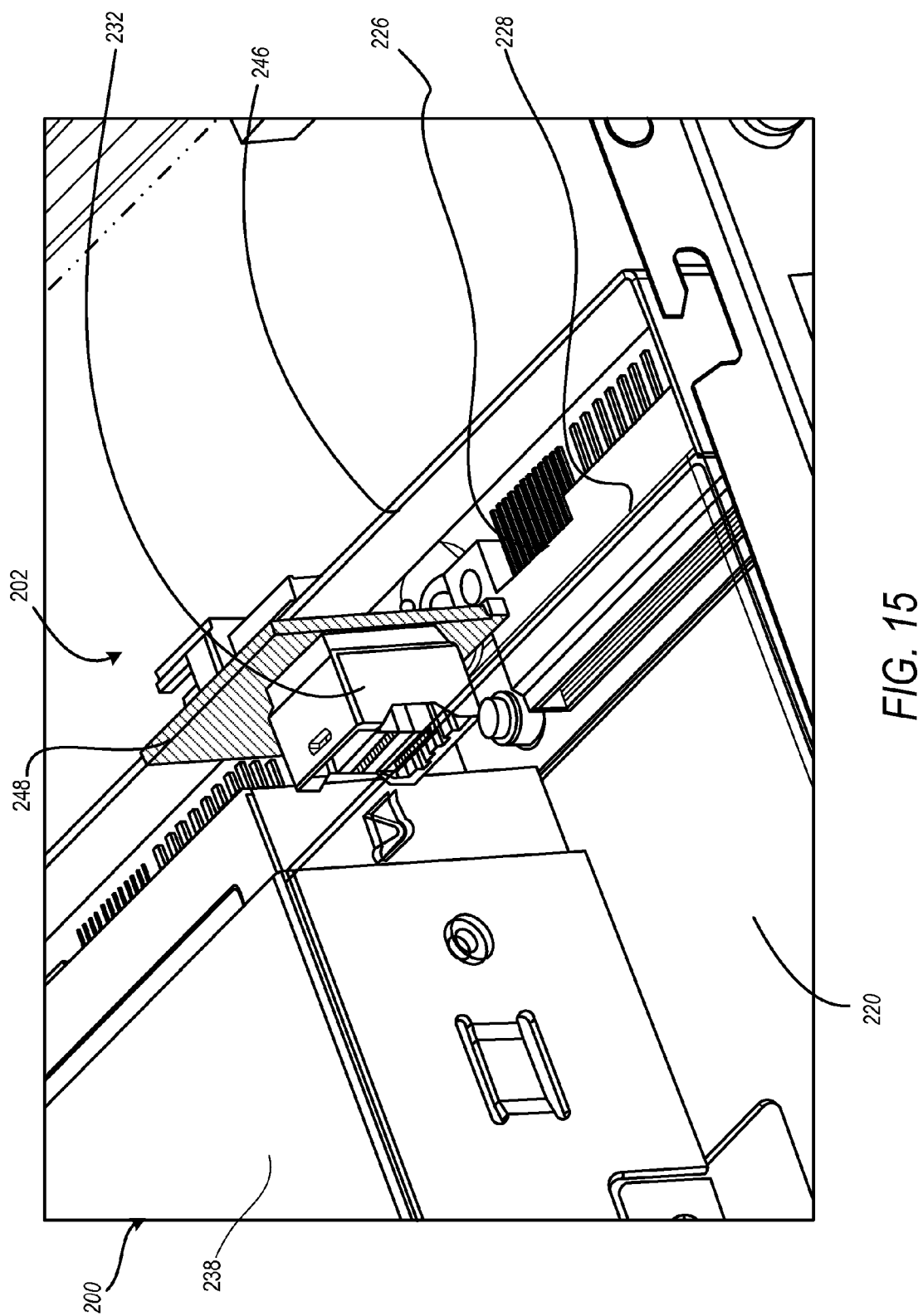
FIG. 15 illustrates a left perspective view of the accessory bay that is partially cutaway to expose first and second electrical connectors for a PSU and a storage module respectively, according to one or more embodiments.
Figure 16:
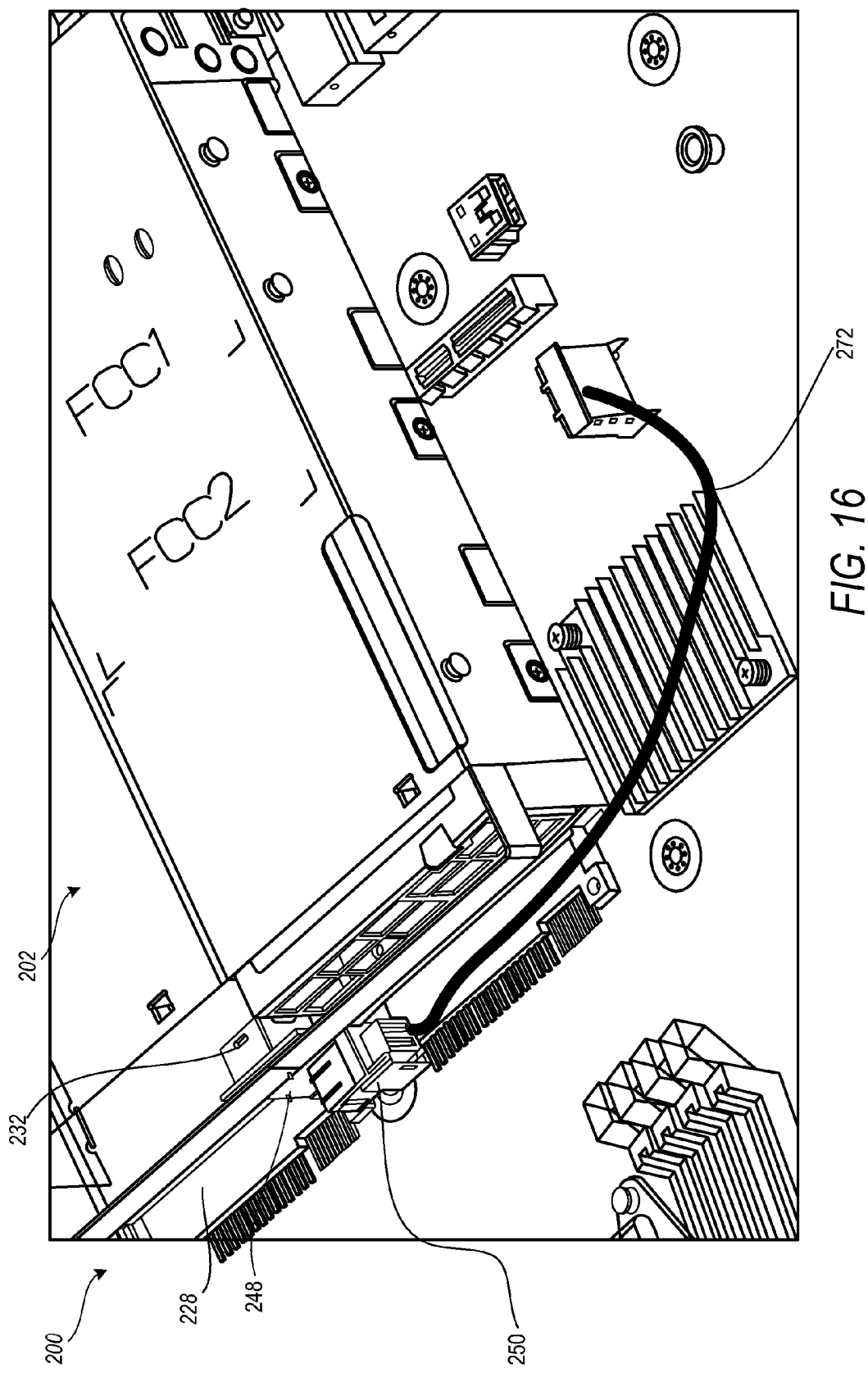
FIG. 16 illustrates a top left perspective view of a storage cable providing an electrical and data connection between the second connector and a motherboard of the IHS, according to one or more embodiments.
Figure 17:
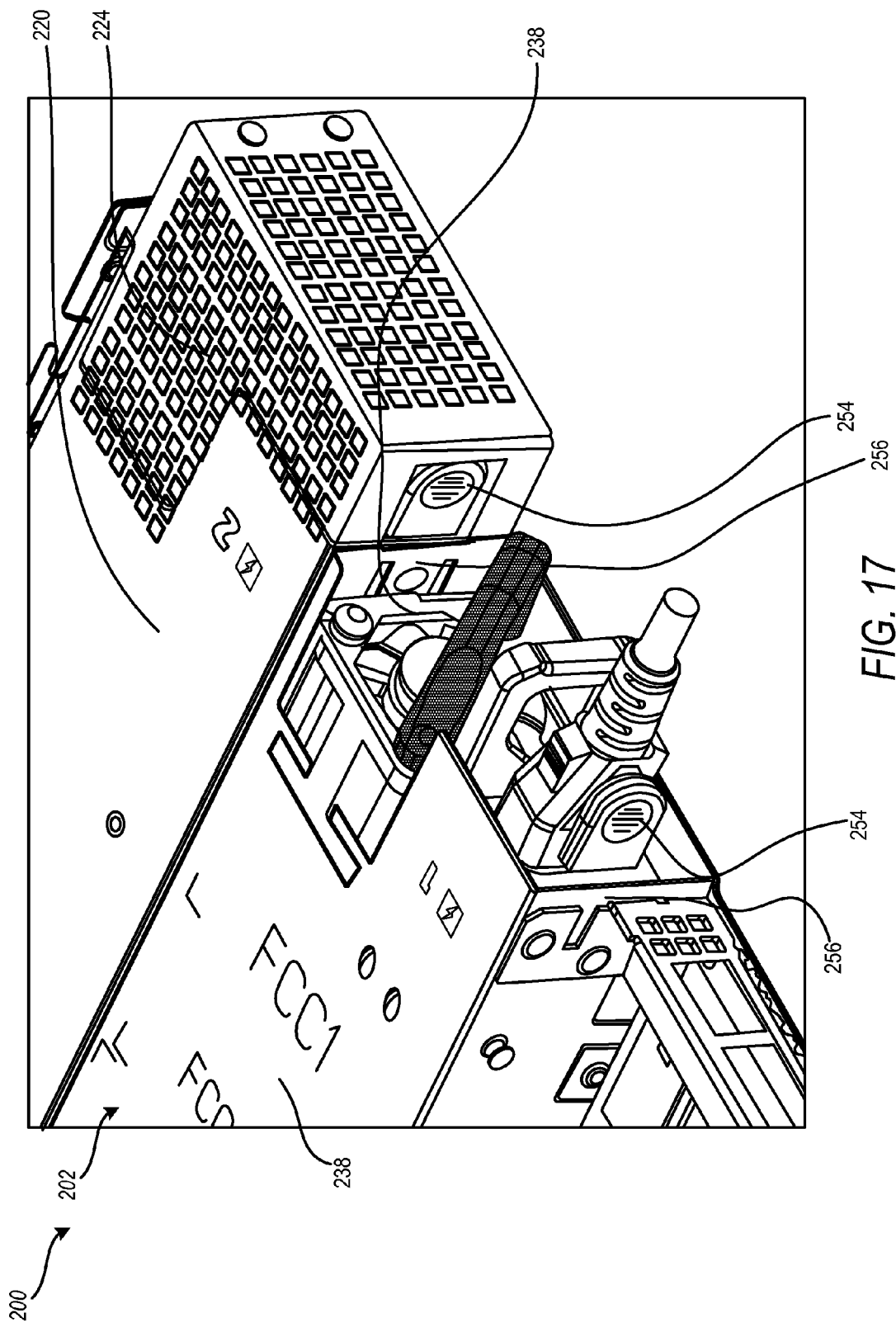
FIG. 17 illustrates a rear left perspective view of the accessory bay, according to one or more embodiments.

FIGS. 9-17 illustrate the storage module 224 of the IHS 200 being assembled and installed, according to one or more embodiments. FIG. 9 illustrates the carrier 260 that provides a base and lateral sides that are closed by a cover 266, which includes the venting structure 258. A latch 254 is mounted to one side of the carrier 260. FIG. 10 illustrates the carrier 260 of FIG. 9 with drive modules 264 and an interposer structure 268 that electrically connects to two juxtaposed drive modules 264. FIG. 11 illustrates another pair of juxtaposed drive module 264 and interposer structure 268 added to the carrier 260. FIG. 12 illustrates an interposer cable 270 that attaches and electrically communicates between both interposer structures 268 and a storage module connector 234 presented at an insertion end of the carrier 260. FIG. 13 illustrates the storage module connector 234 of the carrier 260 presented for insertion. FIG. 14 illustrates the storage module 224 aligned for insertion into the accessory bay 220. FIG. 15 illustrates the midplane apparatus 226 with the first and second electrical connectors 228, 232 aligned with the accessory bay 220. FIG. 16 illustrates a storage cable 272 connected between midplane-to-motherboard cable connector 250 and the motherboard 214 of the IHS 200. FIG. 17 illustrates the storage module 224 installed in the accessory bay 220 with the latch 254 engaged to the latch engaging surface 256.

Figure 18:
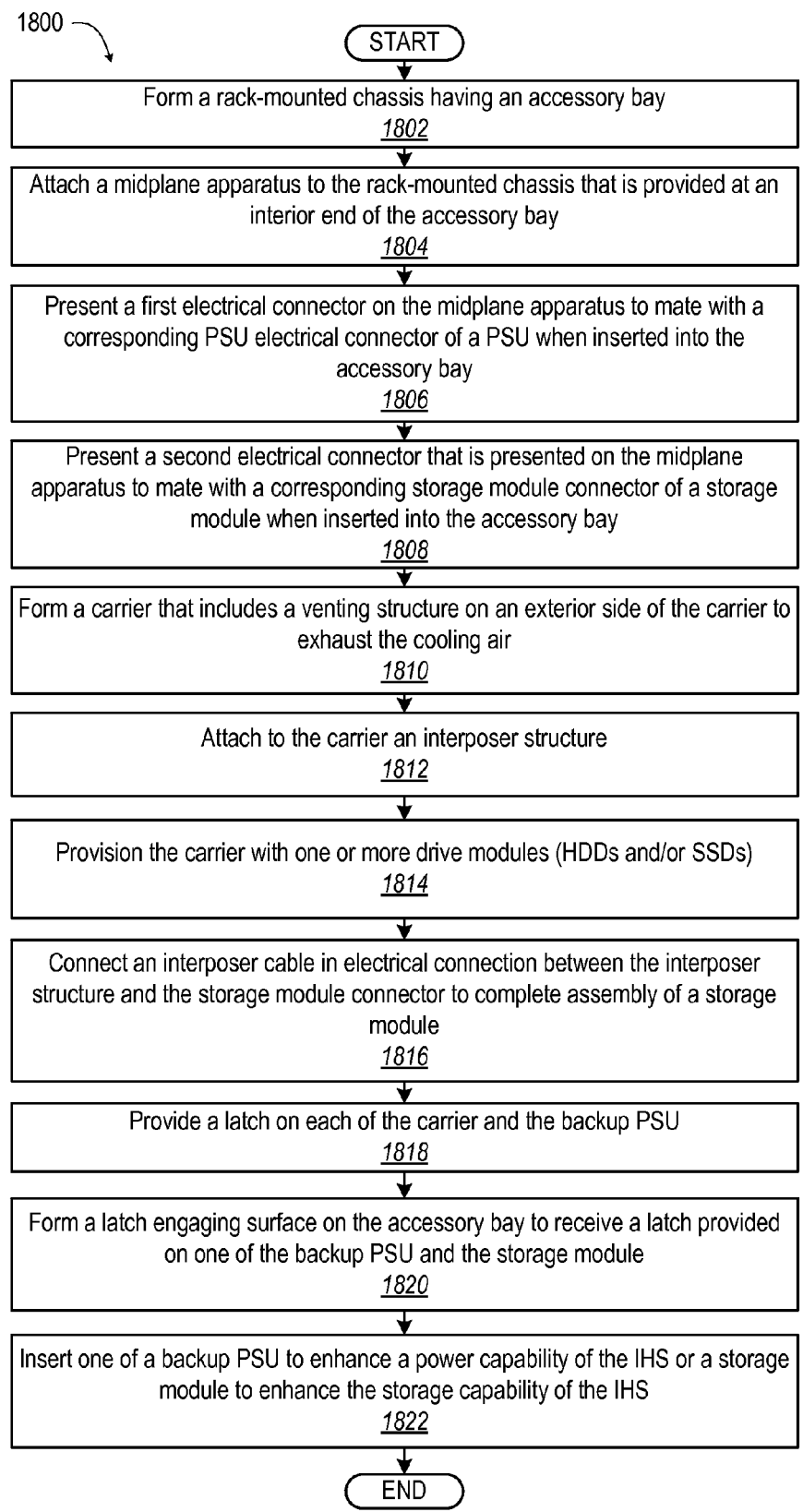
FIG. 18 illustrates a flow diagram of a method of manufacturing an IHS to be selectably configurable for additional storage or power, according to one embodiment.

FIG. 18 illustrates a flow diagram of a method 1800 of manufacturing an IHS that can be selectably configured for additional storage or power capabilities. According to one embodiment, method 1800 includes forming a rack-mounted chassis having an accessory bay (block 1802). The method 1800 includes attaching, to the rack-mounted chassis, a midplane apparatus that is provided at an interior end of the accessory bay (block 1804). The method 1800 includes providing a first electrical connector on the midplane apparatus to mate with a corresponding PSU electrical connector when a PSU is inserted into the accessory bay (block 1806). The method 1800 includes providing a second electrical connector that is presented on the midplane apparatus to mate with a corresponding storage module connector when a storage module is inserted into the accessory bay (block 1808).

The method 1800 includes forming a carrier that includes a venting structure on an exterior side of the carrier to exhaust the cooling air (block 1810). The method 1800 includes attaching to the carrier an interposer structure (block 1812). The method 1800 includes provisioning the carrier with one or more drive modules (HDDs and/or SSDs) (block 1814). The method 1800 includes connecting an interposer cable in electrical connection between the interposer structure and the storage module connector to complete assembly of a storage module (block 1816). The method 1800 includes providing a latch on each of the carrier and the backup PSU (block 1818). The method 1800 includes forming a latch engaging surface on the accessory bay to receive a latch provided on one of the backup PSU and the storage module (block 1820). The method 1800 can include inserting one of a backup PSU to enhance a power capability of the IHS or a storage module to enhance the storage capability of the IHS (block 1822).

Figure 19:
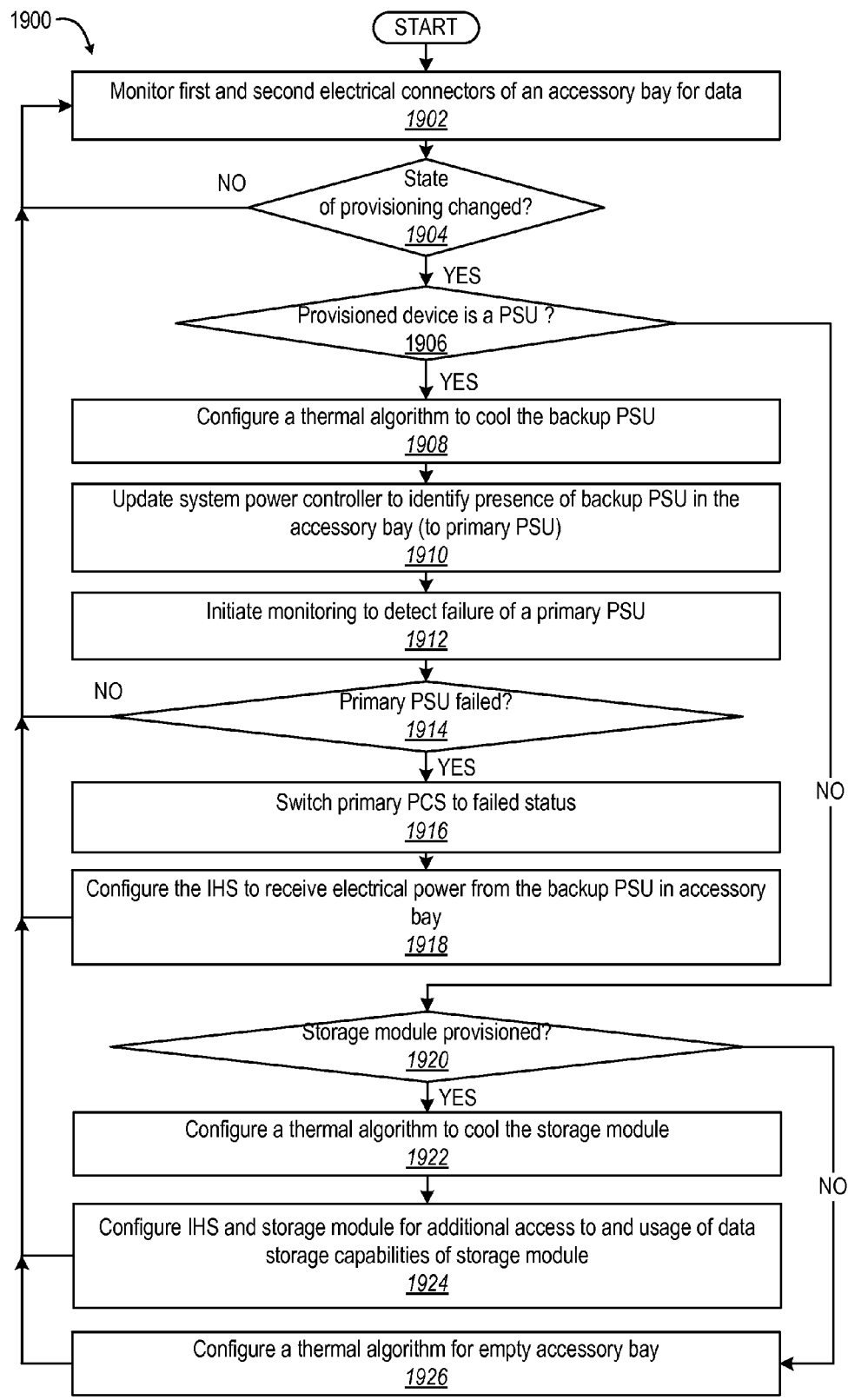
FIG. 19 illustrates a flow diagram of a method of operating an IHS to selectably configure the IHS for additional storage or power, according to one embodiment.

FIG. 19 illustrates a flow diagram of a method of selectably configuring the IHS for additional storage or power as well as optimizing a cooling algorithm for the configuration. According to one embodiment, the method 1900 includes monitoring for data from a first electrical connector and a second electrical connector in order to detect a state of provisioning of the accessory bay of empty, backup PSU or storage module (block 1902). The method 1900 includes determining whether the state of provisioning indicates a change in provisioning (decision block 1904). In response to determining in decision block 1904 that the state of provisioning has not changed, method 1900 returns to block 1902 to continue monitoring provisioning.

In response to determining in decision block 1904 that the state of provisioning has changed, method 1900 makes a further determination as to whether data is received and identified from the first electrical connector that is indicative of a backup PSU provisioned in the accessory bay (decision block 1906). In response to determining in decision block 1906 that the provisioned device is a PSU, the method 1900 includes configuring a cooling algorithm for the thermal requirements and the changes to air flow impedance that are associated with a backup PSU in the accessory bay (block 1908). The method 1900 includes updating a system power controller to identify the presence of a backup PSU to a primary PSU (block 1910). The method 1900 includes monitoring the primary PSU to detect failure (block 1912). The method 1900 includes determining whether the primary PSU has experienced a failure (decision block 1914). In response to determining in decision block 1914 that the primary PSU has not failed, the method 1900 includes returning to block 1902 to monitor for any change to use of the accessory bay. In response to determining in decision block 1914 that the primary PSU has failed, the method 1900 includes switching the primary PSU to failed status (block 1916). The method 1900 includes configuring the IHS to receive electrical power from the backup PSU in the accessory bay (block 1918). Then method 1900 returns to block 1902 to monitor for any change to use of the accessory bay.

In response to determining in decision block 1906 that data has not been received and identified from the first electrical connector, the method 1900 includes determining whether data is received and identified from the second electrical connector that is indicative of a storage module provisioned in the accessory bay (decision block 1920). For example, the data received can be in the form of electrically detecting presence detection pins of an electrical connector. User data stored on the storage module is generally not accessed until the IHS is fully booted up or the hot swap configuring of the IHS for using the storage module is completed. In response to determining in decision block 1920 that data is received and identified from the second electrical connector that is indicative of a storage module provisioned in the accessory bay, the method 1900 includes configuring a cooling algorithm for the thermal requirements and the changes to air flow impedance that are associated with a storage module in the accessory bay (block 1922). The method 1900 configures the IHS and storage module for additional access to and usage of data storage capabilities of the storage module (block 1924). Then method 1900 returns to block 1902 to monitor for any change to use of the accessory bay.

In response to determining in decision block 1920 that no data is received and identified from the second electrical connector that is indicative of a storage module in the accessory bay, method 1900 includes configuring a cooling algorithm for the thermal requirements and the changes to air flow impedance that are associated with an empty accessory bay (block 1926). Then method 1900 returns to block 1902 to monitor for any change to use of the accessory bay.

In the above described flow chart of FIG. 18, one or more of the methods may be embodied in an automated manufacturing of a chassis of an IHS that performs a series of functional processes. Also, in the above described flow chart of FIG. 19, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising:
   a chassis having a dual purpose, single accessory bay that is accessible from an exterior of the IHS for insertion of a single one of (i) a power supply unit (PSU) and (ii) a storage unit; and
   a midplane apparatus attached to the chassis at an interior end of the single accessory bay and having both (1) a first electrical connector for electrically connecting to a PSU connector when a PSU is inserted into the accessory bay and (2) a second electrical connector for electrically communicating with a storage module connector when a storage module is inserted into the single accessory bay; wherein the dual purpose, single accessory bay supports singular insertion of a selected one of the PSU and the storage module to enhance the IHS.

2. The IHS of claim 1, wherein the chassis further has a primary PSU bay separate from the single accessory bay, the IHS further comprising:
   a primary PSU received in the primary PSU bay; and
   a power controller which functions (i) to detect insertion of a backup PSU into the single accessory bay, (ii) to detect a failure of the primary PSU, and (iii) to switch from the primary PSU to the backup PSU in response to detecting both a presence of the backup PSU and the failure of the primary PSU.

3. The IHS of claim 1, further comprising:
   a storage controller that detects, via the second electrical connector, insertion of a storage module into the single accessory bay and which (i) configures the IHS to utilize additional storage capacity provided by insertion of the storage module within the assessor bay and (ii) configures the storage module for access and data storage in response to detecting the storage module.

4. The IHS of claim 1, further comprising:
   a thermal controller that receives and identifies data received via the first and second electrical connectors from any storage module or PSU that is inserted in the single accessory bay and which configures a thermal algorithm to cool a specific inserted module in response to receiving and identifying the data from the storage module or the PSU.

5. The IHS of claim 1, wherein the chassis is a rack-mounted chassis.

6. The IHS of claim 1, wherein:
   the accessory bay comprises a latch engaging surface to receive a latch provided on one of the PSU and the storage module;
   when a PSU is inserted, the PSU includes a latch to releasably engage the latch engaging surface; and
   when a storage module is inserted, the storage module includes a carrier which comprises a latch to releasably engage the latch engaging surface.

7. The IHS of claim 1, wherein the storage module comprises:
   a carrier that is received within the single accessory bay; and
   one or more drive modules provisioned within the carrier.

8. The IHS of claim 7, wherein the one or more drive modules comprise selected ones of hard disk drives (HDDs) and solid state drives (SDDs).

9. The IHS of claim 7, wherein a carrier of the inserted module comprises a venting structure on an exterior side to exhaust the cooling air to a hot aisle.

10. The IHS of claim 7, wherein the carrier further comprises:
    an interposer structure in electrical connection with the one or more drive modules; and
    an interposer cable in electrical connection between the interposer structure and the storage module connector.

11. A method of selectively provisioning an information handling system (IHS) with storage and power capabilities, the method comprising:
    forming a chassis having a single accessory bay;
    attaching a midplane apparatus to the chassis and that is provided at an interior end of the single accessory bay;
    presenting a first electrical connector on the midplane apparatus to mate with a corresponding power supply unit (PSU) connector electrical connector of a PSU when inserted into the single accessory bay; and
    presenting a second electrical connector that is presented on the midplane apparatus to mate with a corresponding storage module connector of a storage module when inserted into the single accessory bay.

12. The method of claim 11, wherein forming the chassis comprises forming a rack-mounted chassis.

13. The method of claim 11, further comprising forming a storage module that includes a carrier that is provisioned with one or more drive modules and that is received within the single accessory bay.

14. The method of claim 13, further comprising:
    providing a latch on each of the carrier and the PSU; and
    forming a latch engaging surface on the single accessory bay to receive the latch provided on one of the PSU and the storage module.

15. The method of claim 13, wherein forming the carrier comprises forming a venting structure on an exterior side to exhaust the cooling air.

16. The method of claim 13, wherein forming the carrier further comprises:

attaching to the carrier an interposer structure that is in electrical connection to the one or more drive modules; and connecting an interposer cable in electrical connection between the interposer structure and the storage module connector.

17. The method of claim 11, wherein the chassis further includes a primary PSU bay, the method further comprising:
detecting a backup PSU in the single accessory bay;
detecting a failure of a primary PSU in the primary PSU bay; and
switching from the primary PSU to the backup PSU in response to detecting both the backup PSU and the failure of the primary PSU.

18. The method of claim 11, further comprising:
detecting, via the first and second electrical connectors, whether a storage module or a PSU is provisioned in the single accessory bay; and
configuring a thermal algorithm to cool the specific inserted module in response to detecting the storage module or the PSU.

19. A method of selectively configuring an information handling system (IHS) with storage and power capabilities, the IHS having a chassis including a single accessory bay that is accessible from an exterior of IHS, the IHS further having a midplane apparatus attached to the chassis at an interior end of the single accessory bay and having both (1) a first electrical connector for electrically connecting to a power supply unit (PSU) connector when a PSU is inserted into the single accessory bay and (2) a second electrical connector for electrically communicating with a storage module connector when a storage module is inserted into the single accessory bay; wherein the single accessory bay supports insertion of one of the PSU and the storage module to enhance the IHS, the method comprising:
detecting via the first electrical connector a PSU in the single accessory bay;
configuring the IHS to receive electrical power from the PSU in response to detecting the PSU;
detecting via the second electrical connector a storage module in the single accessory bay; and
configuring the storage module for access in response to detecting the storage module.

* * * * *